(12) United States Patent
Austin et al.

(10) Patent No.: US 7,362,554 B2
(45) Date of Patent: Apr. 22, 2008

(54) ELECTROSTATIC DISCHARGE (ESD) CLAMP USING OUTPUT DRIVER

(75) Inventors: James Dub Austin, Austin, TX (US); Kenneth W. Fernald, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 501 days.

(21) Appl. No.: 10/431,942

(22) Filed: May 8, 2003

(65) Prior Publication Data

US 2004/0223273 A1 Nov. 11, 2004

(51) Int. Cl.
    *H02H 3/22* (2006.01)
(52) U.S. Cl. ......................... 361/56; 361/111
(58) Field of Classification Search ............... 361/111, 361/56–58, 91.1, 54; 257/362; 327/198, 327/328, 215
See application file for complete search history.

(56) References Cited

U.S. PATENT DOCUMENTS

| | | | | |
|---|---|---|---|---|
| 5,910,873 A * | 6/1999 | Boluna et al. | ................ | 361/56 |
| 6,043,970 A * | 3/2000 | Song et al. | ................ | 361/111 |
| 6,249,410 B1 * | 6/2001 | Ker et al. | ................ | 361/56 |
| 6,369,994 B1 * | 4/2002 | Voldman | ................ | 361/56 |
| 6,545,520 B2 * | 4/2003 | Maloney et al. | ............ | 327/313 |
| 6,653,878 B2 * | 11/2003 | Nolan | ................ | 327/170 |

* cited by examiner

*Primary Examiner*—Michael Sherry
*Assistant Examiner*—Danny Nguyen
(74) *Attorney, Agent, or Firm*—Howison & Arnott, L.L.P.

(57) ABSTRACT

Electrostatic discharge (ESD) clamp using output driver. An electrostatic discharge (ESD) protection device for an output driver having a p-channel transistor and n-transistor pair connected between a power supply terminal and ground for driving an input/output pad therefrom. An ESD event detector is provided for detecting an ESD event on the pad. A drive circuit drives the n-channel and p-channel drive transistors in response to receiving a logic control signal to either drive the pad from the supply terminal or to sink the pad to ground. ESD protection logic circuitry is provided to cause both the p-channel and n-channel transistors to turn on when the ESD event detector detects an ESD event, the ESD protection circuitry disposed forward of the drive circuit such that the ESD protection logic circuitry operates independent of the state of the drive circuit.

6 Claims, 2 Drawing Sheets

ELECTROSTATIC DISCHARGE (ESD) CLAMP USING OUTPUT DRIVER

TECHNICAL FIELD OF THE INVENTION

The present invention pertains in general to protection devices and, more particularly, to protection devices for protecting integrated circuit devices from electrical transients, including electrostatic discharge (ESD) events.

BACKGROUND OF THE INVENTION

Integrated circuit devices have been subject to ever increasing susceptibility to damage from applications of excessive voltages, for example, by electrostatic discharge (ESD) events. This susceptibility is due, in large part, to ever decreasing gate oxide thicknesses which have resulted as very large scale integration (VLSI) circuit geometries continued to shrink. In particular, during an ESD event, charge is transferred between one or more pins of the integrated circuit to another conducting object in a time period that is typically less than one microsecond. This charge transfer can generate voltages that are large enough to break down insulating film (e.g., gate oxides) on the device, or can dissipate sufficient energy to cause electrothermal failures in the device. Such failures include contact spiking, silicon melting, or metal interconnect melting.

There have been many attempts made in the prior art to protect semiconductor devices, with particular attention to the problem of protecting field effect transistor devices from such ESD events. In the early days of MOS technology, a simple clamp was utilized such that a high voltage or ESD event on a pad or input pin associated with the integrated circuit resulted in "clamping" the voltage to ground with use of simple clipping diodes. Further, structures were incorporated in the circuitry associated with one or more of the input/output (IO) circuits that utilized reverse breakdown semiconductor junctions that would become conductive at high voltages. However, these devices sometimes prove to be insufficient to completely absorb the energy due to the conductivity therethrough or the speed thereof.

Recent ESD devices utilize clamping transistors that are turned on in the event of an ESD event. The control circuitry for this transistor typically includes a resistor and capacitor connected in series between the power supply and ground. Whenever an ESD event occurred that either pulled the pad below ground or above the supply terminal, the pn junction associated with a drive transistor, for example, on the pad would be forward biased and cause the ESD transistor to turn on and clamp the output across the output drive transistors to prevent damage thereto. However, the circuitry must be added to each I/O circuit and corresponding pad.

SUMMARY OF THE INVENTION

The present invention disclosed and claimed herein, in one aspect thereof, comprises an electrostatic discharge (ESD) protection device for protecting an integrated circuit with associated terminals, each having a functional relationship to the operation of the integrated circuit, the integrated circuit having an output driver with a p-channel transistor and n-transistor pair connected between one of the terminals configured as a power supply terminal and one of the terminals configured as a ground terminal for driving an associated one of the terminals configured as an input/output pad. An ESD event detector is provided for detecting an ESD event on any of the terminals. A drive circuit drives the n-channel and p-channel drive transistors in response to receiving a logic control signal to either drive the pad from the supply terminal or to sink the pad to ground. ESD protection logic circuitry is provided to cause both the p-channel and n-channel transistors to turn on when the ESD event detector detects an ESD event, the ESD protection circuitry disposed forward of the drive circuit such that the ESD protection logic circuitry operates independent of the state of the drive circuit.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
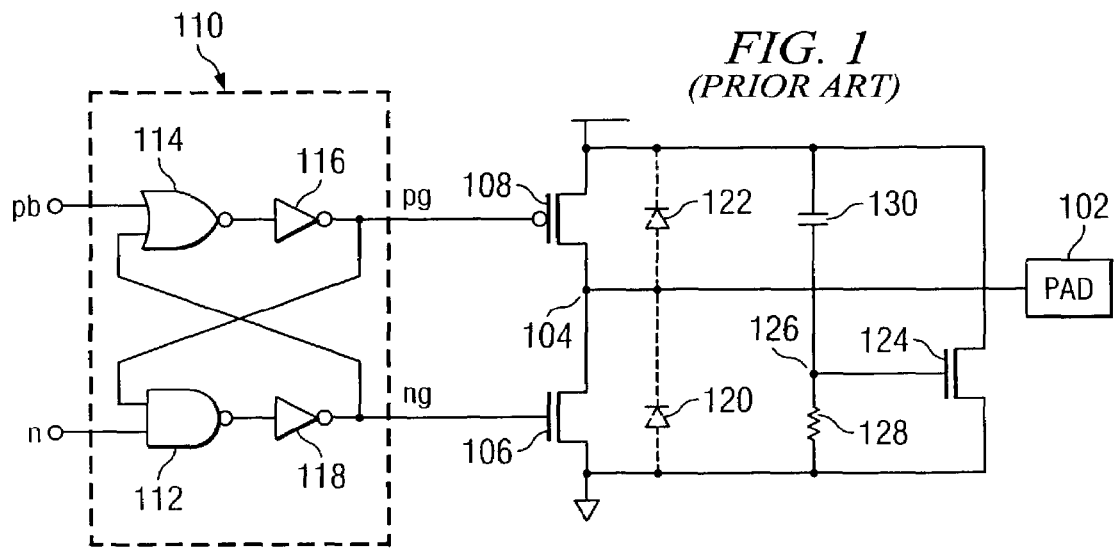
FIG. 1 illustrates a prior art non overlap logic generator for driving a pair of output drive transistors and an ESD protection circuit.

Referring now to FIG. 1, there is illustrated a logic diagram for a prior art ESD protection device. A pad 102 is provided that provides an input/output (I/O) function for the integrated circuit. It should be understood that there are many pads typically associated with an integrated circuit, only one of which is illustrated in the embodiment of FIG. 1. The pad 102 is typically driven by a driver circuit for driving a node 104 connected to pad 102. The driver circuit consists of an n-channel transistor 106 operable to drive the node 104 to ground, transistor 106 having the source-drain path thereof connected between node 104 and ground. The driver circuit is also comprised of a p-channel transistor 108 for pulling the node 104 up to $V_{dd}$, this allowing current to be driven to the node 104 through the source-drain path of transistor 108 connected between $V_{dd}$ and node 104.

A non-overlap logic generator 110 is provided for driving the gates of transistors 106 and 108. The drive signal for the gate of transistor 106 is referred to as an "ng" drive signal and the drive for the gate of transistor 108 is referred to as a "pg" drive signal. Generator 110 receives two inputs, an "n" drive input and an "pb" drive input. The generator is operable to allow for tri-stating of the driver such that the gate of transistor 108 will remain high and the gate of transistor 106 will remain low such that there is no conduction there through in the tri-state configuration.

The generator 110 is comprised of a NAND gate 112 having one input thereof connected to the "n" input signal the other input thereof connected to the "pg" output node on the gate of transistor 108. A NOR gate 114 has one input thereof connected to the "pb" input signal and the other input thereof connected to the "ng" output signal that drives transistor 106. The output of NOR gate 114 is input to an inverter 116, the output thereof connected to the "pg" drive signal to transistor 108. The output of NAND gate 112 is connected to the input of an inverter 118, the output thereof connected to the "ng" output signal that drives transistor 106.

In operation, when the state of the pad 102 is low, and "pb" goes low, pad 102 will remain low until the state of "n" goes low. When "n" goes low, the output of NAND gate 112 goes high and the output of inverter 118 goes low, turning off transistor 106 and driving pad 102 high, since NOR gate 114 will drive the output of inverter 116 low and turn on transistor 108. If "n" then goes high, and then "pb" goes high, then the output of inverter 16 will be driven high, turning off transistor 108 and driving the output of NAND gate low and the output of inverter 118 high, turning on transistor 106.

For the purpose of addressing ESD events, the transistors 106 and 108 must be protected in the event that the pad 102 is subjected to a high-going spike or a low-going spike as well as all internal transistors connected to node 104 and the supply nodes. Illustrated in FIG. 1 in phantom is an intrinsic diode 120 having the anode connected to ground and the cathode thereof connected to the node 104, and a phantom diode 122 having the anode thereof connected to node 104 and the cathode thereof connected to $V_{dd}$. The diodes 120 and 122 are an intrinsic part of the transistors 106 and 108, as is well know in the art. Further, the transistors 106 and 108 can be fabricated to accentuate or provide an enhanced ESD pn junction across the transistor. In general, the diode results from the p-substrate for the n-channel transistor 106, for example, that is connected to ground wherein the pn junction exists between the source and drain in transistor 106 (or transistor 108) and the p-substrate. For a p-channel device, the diode is between the p-drain and the n-well connected to $V_{dd}$.

Figure 2:
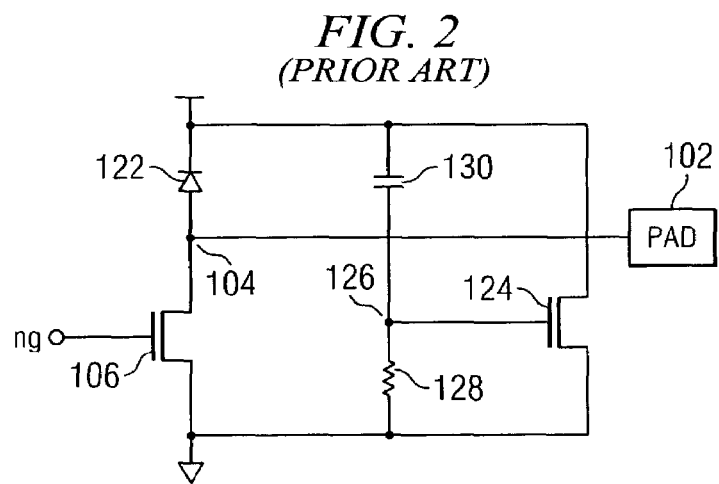
FIGS. 2 and 3 illustrate details of the prior art configuration of FIG. 1.
Figure 3:
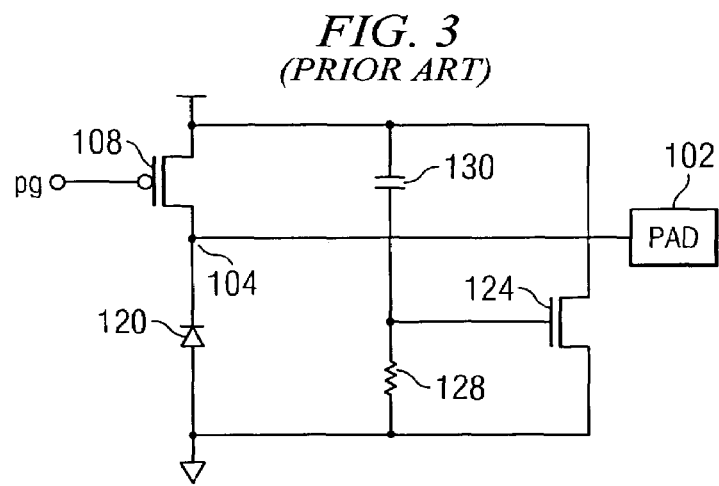

With reference to FIGS. 2 and 3, there is illustrated a detail of a high going spike and a low going spike, respectively. When the pad 102 is pulled high in the presence of an ESD event, this will cause diode 122 to become forward biased and conduct. If, on the other hand, the pad 102 were pulled low below ground, this would cause diode 120 to conduct. A clamp n-channel transistor 124 is provided with the source/drain path thereof connected between the $V_{dd}$ and ground and the gate thereof connected to a node 126. Node 126 is connected to one side of a resistor 128, the other side thereof connected to ground, node 126 also connected to one plate of a capacitor 130, the other side thereof connected to $V_{dd}$. When the pad 102 goes high, diode 122 will pull the top plate of capacitor 130 at the $V_{dd}$ terminal high, thus pulling node 126 high and turning transistor 124 on. When pad 102 goes low, diode 120 will pull the ground node low, with node 126 remaining high due to the fact that the capacitor 130 is still connected on the top plate thereof to $V_{dd}$. This will cause transistor 124 to conduct and "clamp" $V_{dd}$ and ground, thus protecting transistors 106 and 108. (Note that a p-channel transistor could have been utilized as the clamp transistor by merely reversing the capacitor 130 and resistor 128 of FIG. 1).

Figure 4:
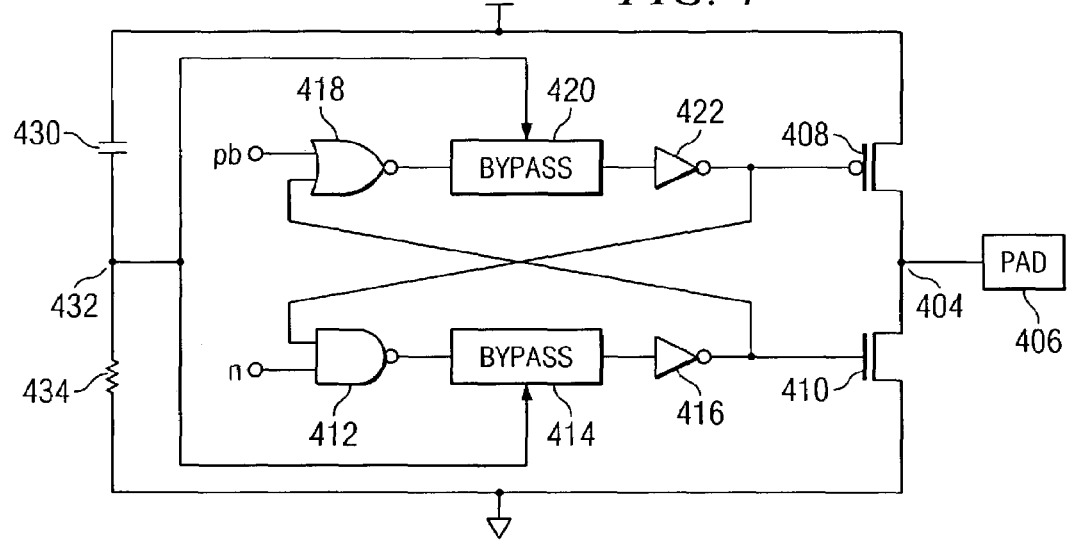
FIG. 4 illustrates a general diagrammatic view of the ESD protection device of the present disclosure.

Referring now to FIG. 4, there is illustrated an overall logic diagram of the ESD protection circuit of the present disclosure. The output is provided on a node 404 that drives an output pad 406. Two drive transistors, a p-channel transistor 408 and an n-channel transistor 410 are provided with the source-drain path of the p-channel transistor 408 connected between $V_{dd}$ and node 404, and the source-drain path of transistor 410 connected between node 404 and ground. The gate of transistor 408 and the gate of transistor 410 are driven by a non-overlap logic generator, as was described hereinabove with reference to FIG. 1. The input signals to the generator are comprised of the primary "n" drive logic signal and the "pb" drive signal. The "n" signal is input to one input of a two-input NAND gate 412, the other input thereof connected to the gate of transistor 408. The output of the NAND gate 412 is connected to the input of a bypass circuit 414, the output thereof connected to the input of an inverter 416, the output of inverter 416 driving the gate of transistor 410. The "pb" signal is input to one input of a two-input NOR gate 418, the other input thereof connected to the output of inverter 416. The output of the NOR gate 418 is connected to the input of a bypass circuit 420, the output thereof connected to the input of an inverter 422, the output of inverter 422 connected to the gate of transistor 408. When the bypass circuits 414 and 420 are operating to bypass the logic function associated therewith, the generator of FIG. 4 will operate identical to the generator 110 of FIG. 1.

An ESD capacitor 430 has a top plate thereof connected to $V_{dd}$ and a bottom plate thereof connected to an ESD control node 432. An ESD resistor 434 is connected between node 432 and ground. The ESD control node 432 is connected to a control input on both of the bypass circuits 420 and 414.

As noted herein above, each of the transistors 408 and 410 has associated therewith an intrinsic diode (not shown), such that raising of the pad 406 high through an ESD event will result in the diode pn junction associated with transistor 408 being forward biased and pulling the $V_{dd}$ terminal high relative to ground. This will cause node 432 to be pulled up, which will cause bypass circuit 414 to output a low signal regardless of the state of any of the other logic circuitry and drive a logic high on the output of inverter 416 turning on transistor 410, and bypass circuit 420 will also output a logic "high" state to drive the output of inverter 422 low, turning on transistor 408, such that transistor 410 and 408 clamp $V_{dd}$ to ground. The bypass circuits 414 and 420 are pushed "forward" of the controlling logic circuitry embodied in the NOR gate 418 and the NAND gate 412. This bypass circuits 414 and 420 therefore utilizes the source/drain path transistors 408 and 410 in lieu of a separate n-channel transistor clamp for clamping $V_{dd}$ to ground.

Figure 5:
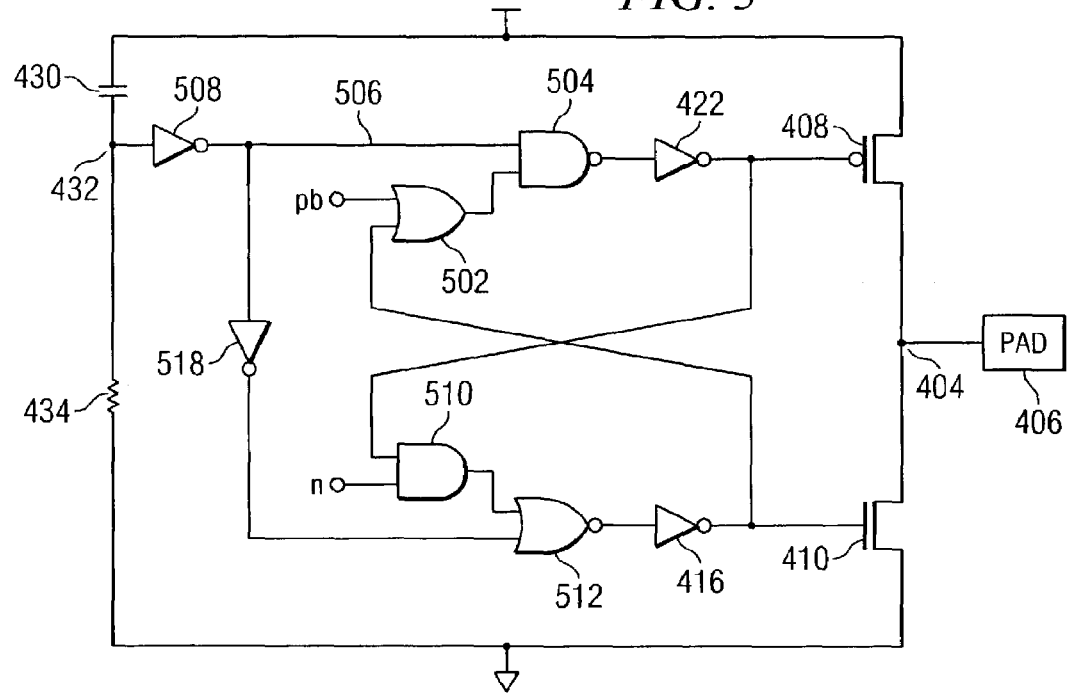
FIG. 5 illustrates a more detailed logic diagram of the ESD protection device in association with the output drive circuitry of the present disclosure.

Referring now to FIG. 5, there is illustrated a detailed logic diagram of a circuit FIG. 4 and the bypass circuitry 414 and 420. The pb signal is input to one input of a two input OR gate 502, the other input thereof connected to the gate of transistor 410. The output of OR gate 502 is connected to one input of the two input NAND gate 504, the other input thereof connected to a node 506. Node 506 is connected to the output of an inverter 508, the input thereof connected to the ESD control node 432. The output of NAND gate 504 is connected to the input of inverter 422 in order to drive the gate of transistor 408.

The "n" input signal is input to one input of a two-input AND gate 510, the other input thereof connected to the output of inverter 422. The output of AND gate 510 is input to one input of a two-input NOR gate 512, the output thereof connected to the input of the inverter 416 and the other input of NOR gate 512 is connected to the output of an inverter 518, the input of inverter 518 connected to node 506. It should be noted that the other input of NOR gate 512 not connected to the output of AND gate 510 could be connected directly to node 532. By utilizing the inverter 518, some "clock bouncing" can be ameliorated.

In operation, when "n" is at a logic "low," the output of AND gate 510 is low and, when no ESD event is present, the output of inverter 518 will be low due to node 432 being low. This will result in the output of NOR gate 512 being high and the output of inverter 416 being low, thus turning off transistor 410. This will also place a logic "low" on the input to OR gate 502. Shortly thereafter, "pb" is taken low, which will result in the output of OR gate 502 going low and the output of AND gate 504 being high and the output of inverter 422 being low, turning on transistor 408.

For the opposite logic state, "pb" goes high, resulting in a logic high to the input of NAND gate 504. The other input to NAND gate 504, during a non-ESD event will be high, such that the output of NAND gate 504 is low and the output of inverter 422 is high, turning off transistor 408. "n" goes high, raising the output of AND gate 510 high and causing the output of NOR gate 512 to go low and the output of inverter 416 to go high, turning on transistor 410. Transistor 408 will therefore be turned off and transistor 410 turned on.

During a high going ESD event, node 432 will be "high" due to the intrinsic pn junction in transistor 408 being forward biased and current being driven to the $V_{dd}$ terminal. This will result in node 506 being pulled low, which results in the output of NAND gate 504 going high and the output of inverter 422 going low and turning on transistor 408. Similarly, the output of inverter 518 will be at a logic "high" resulting in the output of NOR gate 512 going low and the output of inverter 416 going high, turning on transistor 410. Therefore, for a high going ESD event, transistors 408 and 410 will be turned on clamping the $V_{dd}$ to ground.

In the opposite condition, wherein the pad is subjected to a negative-going ESD event, ground will be pulled low resulting in node 432 being at a "high" voltage level to cause node 506 to go low. This will also result in transistors 408 and 410 being turned on. It is noted that the logic associated with the gates 502 and 510, which form part of the non-overlap generator are not a portion of the control logic that controls transistors 408 and 410 being turned on during the ESD event. As such, the gates 504 and 512 associated with the bypass operation are disposed "forward" of the normally operating gate logic. In general, the gates 502 and 504 are referred to as an OR-NAND configuration and the gates 510 and 512 are referred to as an AND-NOR combination.

Although the preferred embodiment has been described in detail, it should be understood that various changes, substitutions and alterations can be made therein without departing from the spirit and scope of the invention as defined by the appended claims.

What is claimed is:

1. An electrostatic discharge (ESD) protection device for protecting an integrated circuit with associated terminals, each having a functional relationship to the operation of the integrated circuit, the integrated circuit having an output driver with a p-channel transistor and n-transistor pair connected between one of the terminals configured as a power supply terminal and one of the terminals configured as a ground terminal for driving an associated one of the terminals configured as an input/output pad, comprising:
   an ESD event detector for detecting an ESD event on one of the terminals;
   a drive circuit for driving the n-channel and p-channel drive transistors in response to receiving a logic control signal to either drive the pad from the supply terminal or to sink the input/output pad to ground, wherein said drive circuit comprises a non overlap generator for receiving first and second inputs and driving the n-channel and p-channel transistors such that changing of a logic input state is facilitated by changing the one of the n-channel and p-channel transistors currently in a conducting state to a non conducting state prior to changing the other of the n-channel and p-channel transistors in the non conducting state to a conducting state; and
   ESD protection logic circuitry to cause both said p-channel and n-channel transistors to turn on when said ESD event detector detects an ESD event, said ESD protection logic circuitry disposed forward of and separate from said drive circuit such that said ESD protection logic circuitry operates independent of the state of said drive circuit.

2. The ESD protection device of claim 1, wherein said ESD event detector comprises a capacitor connected between the supply terminal and a detect output node and a resistive device connected between the ground terminal and said detect output node, the state of said detect output node being above ground in the presence of an ESD event which is expressed by either a high going voltage spike or a low going voltage spike.

3. An electrostatic discharge (ESD) protection device for protecting an integrated circuit with associated terminals, each having a functional relationship to the operation of the integrated circuit, the integrated circuit having an output driver with a p-channel transistor and n-transistor pair connected between one of the terminals configured as a power supply terminal and one of the terminals configured as a ground terminal for driving an associated one of the terminals configured as an input/output pad, comprising:
   an ESD event detector for detecting an ESD event on one of the terminals;
   a drive circuit for driving the n-channel and p-channel drive transistors in response to receiving a logic control signal to either drive the pad from the supply terminal or to sink the input/output pad to ground, wherein said drive circuit comprises a non overlap generator for receiving first and second inputs and driving the n-channel and p-channel transistors such that changing of a logic input state is facilitated by changing the one of the n-channel and p-channel transistors currently in a conducting state to a non conducting state prior to changing the other of the n-channel and p-channel transistors in the non conducting state to a conducting state; and
   ESD protection logic circuitry to cause both said p-channel and n-channel transistors to turn on when said ESD event detector detects an ESD event, said ESD protection circuitry disposed forward of said drive circuit such that said ESD protection logic circuitry operates independent of the state of said drive circuit
   wherein said non overlap generator comprises:
      a AND device for receiving said first input as one input thereto and the drive signal to the p-channel transistor as a second input thereto, the output thereof controlled by the first input when the p-channel transistor is non conducting to provide the drive signal to the n-channel transistor;
      an OR device for receiving said second input as one input thereto and the drive signal to the n-channel transistor as a second input thereto, the output thereof controlled by the second input when the n-channel transistor is non conducting to provide the drive signal to the p-channel transistor;
      said AND device and said OR device operating with said first and second input signals such that the one of the AND or OR devices associated with the conducting one of the p-channel transistor or the n-channel transistor renders the associated driven one of the n-channel or p-channel transistors non conductive, prior to the other one of the AND or OR devices associated with the non conducting one of the p-channel transistor or the n-channel transistor renders the associated driven one of the n-channel or p-channel transistor conductive; and a first ESD control circuit for causing the p-channel transistor to be conductive without regard to the logic state of the AND or OR devices in response to the ESD detection device detecting an ESD event, and a second ESD control circuit for causing the n-channel transistor to be conductive without regard to the logic state of the AND or OR devices in response to the ESD detection device detecting an ESD event.

4. The ESD protection device of claim 3, wherein:

said first ESD control circuit comprises an AND gate disposed on the output of said OR device and having one input thereof for receiving the output of the OR device and the other input thereof controlled by said ESD detection device and the output thereof driving the p-channel transistor, wherein the output thereof is controlled by the OR device in the absence of an ESD event and the AND gate output is controlled to render the p-channel transistor conductive in the presence of an ESD event regardless of the output state of the OR device; and said second ESD control circuit comprises an OR gate disposed on the output of said AND device and having one input thereof for receiving the output of the AND device and the other input thereof controlled by said ESD detection device and the output thereof driving the n-channel transistor, wherein the output thereof is controlled by the AND device in the absence of an ESD event and the OR gate output is controlled to render the n-channel transistor conductive in the presence of an ESD event regardless of the output state of the AND device.

5. A method for providing electrostatic discharge (ESD) for protecting an integrated circuit with associated terminals, each having a functional relationship to the operation of the integrated circuit, the integrated circuit having an output driver with a p-channel transistor and n-transistor pair connected between one of the terminals configured as a power supply terminal and one of the terminals configured as a ground terminal for driving an associated one of the terminals configured as an input/output pad, comprising the steps of:

detecting with an ESD event detector an ESD event on the pad;

driving with a drive circuit the n-channel and p-channel drive transistors in response to receiving a logic control signal to either drive the pad from the supply terminal or to sink the input/output pad to ground;

disposing ESD protection logic circuitry forward of and separate from the drive circuit such that the ESD protection logic circuitry operates independent of the state of the drive circuit, wherein the drive circuit comprises a non overlap generator for receiving first and second inputs and driving the n-channel and p-channel transistors such that changing of a logic input state is facilitated by changing the one of the n-channel and p-channel transistors currently in a conducting state to a non conducting state prior to changing the other of the n-channel and p-channel transistors in the non conducting state to a conducting state; and causing both the p-channel and n-channel transistors to turn on when the ESD event detector detects an ESD event in the step of detecting.

6. The method of claim 5, wherein the ESD event detector comprises a capacitor connected between the supply terminal and a detect output node and a resistive device connected between ground and the detect output node, the state of the detect output node being above ground in the presence of an ESD event which is expressed by either a high going voltage spike or a low going voltage spike.

* * * * *